(12) United States Patent
Kim et al.

(10) Patent No.: US 7,915,738 B2
(45) Date of Patent: Mar. 29, 2011

(54) STACKABLE MULTI-CHIP PACKAGE SYSTEM WITH SUPPORT STRUCTURE

(75) Inventors: Young Cheol Kim, Yongin-si (KR); Koo Hong Lee, Seoul (KR); Jae Hak Yee, Shanghai (CN)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/615,195

(22) Filed: Nov. 9, 2009

(65) Prior Publication Data

US 2010/0052117 A1    Mar. 4, 2010

Related U.S. Application Data

(62) Division of application No. 11/462,568, filed on Aug. 4, 2006, now Pat. No. 7,645,638.

(51) Int. Cl.
*H01L 23/48* (2006.01)
*H01L 23/52* (2006.01)
*H01L 29/40* (2006.01)

(52) U.S. Cl. . 257/777; 257/686; 257/787; 257/E23.043; 257/E23.085

(58) Field of Classification Search ............... 257/685, 257/686, 723, 777, 666, 675, 676, 784, 786, 257/787, 690, 692, 693, E23.004, E23.043, 257/E23.047, E23.048, E25.006, E25.018, 257/E25.021, E25.027, E23.085, E21.614
See application file for complete search history.

(56) References Cited

U.S. PATENT DOCUMENTS

| 5,594,275 A | 1/1997 | Kwon et al. |
| 5,757,080 A * | 5/1998 | Sota ............................. 257/777 |
| 5,870,289 A | 2/1999 | Tokuda et al. |
| 6,020,629 A | 2/2000 | Farnworth et al. |
| 6,239,367 B1 * | 5/2001 | Hsuan et al. .................. 174/528 |
| 6,476,474 B1 * | 11/2002 | Hung ............................ 257/686 |
| 6,534,859 B1 | 3/2003 | Shim et al. |
| 6,590,281 B2 | 7/2003 | Wu et al. |
| 6,677,674 B2 | 1/2004 | Nagao |
| 6,724,074 B2 | 4/2004 | Song et al. |
| 6,759,737 B2 | 7/2004 | Seo et al. |
| 6,764,880 B2 | 7/2004 | Wu et al. |
| 6,784,547 B2 | 8/2004 | Pepe et al. |
| 6,849,949 B1 | 2/2005 | Lyu et al. |
| 6,984,881 B2 | 1/2006 | Takiar |
| 6,998,703 B2 | 2/2006 | Di Stefano |
| 7,045,396 B2 | 5/2006 | Crowley et al. |
| 7,078,794 B2 | 7/2006 | Lee |
| 7,138,704 B2 | 11/2006 | Lien et al. |
| 7,145,247 B2 | 12/2006 | Kawano et al. |
| 7,193,309 B2 | 3/2007 | Huang et al. |

(Continued)

FOREIGN PATENT DOCUMENTS

JP        4340751        11/1992

*Primary Examiner* — A. Sefer
*Assistant Examiner* — Dilinh P Nguyen
(74) *Attorney, Agent, or Firm* — Mikio Ishimaru

(57) ABSTRACT

A stackable multi-chip package system is provided including forming an external interconnect, having a base and a tip, and a paddle; mounting a first integrated circuit die over the paddle; stacking a second integrated circuit die over the first integrated circuit die in a active side to active side configuration; connecting the first integrated circuit die and the base; connecting the second integrated circuit die and the base; and molding the first integrated circuit die, the second integrated circuit die, the paddle, and the external interconnect with the external interconnect partially exposed.

9 Claims, 5 Drawing Sheets

U.S. PATENT DOCUMENTS

| | | |
|---|---|---|
| 7,622,333 B2 | 11/2009 | Kim et al. |
| 7,683,467 B2 | 3/2010 | Jang et al. |
| 2001/0015485 A1 | 8/2001 | Song et al. |
| 2003/0209740 A1 | 11/2003 | Miyamoto et al. |
| 2004/0021230 A1 | 2/2004 | Tsai et al. |
| 2004/0124539 A1 | 7/2004 | Yang et al. |
| 2005/0189623 A1 | 9/2005 | Akram et al. |
| 2006/0249851 A1 | 11/2006 | Karnezos |
| 2008/0029905 A1 | 2/2008 | Merilo et al. |
| 2008/0136005 A1 | 6/2008 | Lee et al. |
| 2008/0136006 A1 | 6/2008 | Jang et al. |
| 2008/0136007 A1 | 6/2008 | Kim et al. |

* cited by examiner

STACKABLE MULTI-CHIP PACKAGE SYSTEM WITH SUPPORT STRUCTURE

CROSS-REFERENCE TO RELATED APPLICATION(S)

This application is a divisional of co-pending U.S. patent application Ser. No. 11/462,568 filed Aug. 4, 2006.

The present application contains subject matter related to concurrently filed U.S. patent application Ser. No. 11/462,588, which is assigned to STATS ChipPAC Ltd.

TECHNICAL FIELD

The present invention relates generally to integrated circuit packages and more particularly to stackable integrated circuit packages.

BACKGROUND ART

Across all sectors, industries, and geographies, demands continue for the electronic industry to provide products that are lighter, faster, smaller, multi-functional, more reliable, and more cost-effective. In order to meet these expanding requirements of so many and varied consumers, more electrical circuits need to be more highly integrated to provide the functions demanded. Across virtually all applications, there continues to be growing demand for reducing size, increasing performance, and improving features of integrated circuits.

The seemingly endless restrictions and requirements are no more visible than with products in our daily lives. Smaller and denser integrated circuits are required in many portable electronic products, such as cell phones, portable computers, voice recorders, etc. as well as in many larger electronic systems, such as cars, planes, industrial control systems, etc. As the demand grows for smaller electronic products with more features, manufacturers are seeking ways to include more features as well as reduce the size of the integrated circuits. However, increasing the density of integration in integrated circuits may be expensive and have technical limitations. Though technology continues its growth to once unimagined extents, practical limits of individual integrated circuits do exist.

To meet these needs, three-dimensional type integrated circuit packaging techniques have been developed and used. Packaging technologies are increasingly using smaller form factors with more circuits in three-dimensional packages. In general, package stacks made by stacking packages and stacked chip packages made by stacking chips in a package have been used. Package stacks may be manufactured by stacking packages that have already passed the necessary tests for their functions. Therefore, the yields and reliability of these package stacks may be higher than those stacked chip packages manufactured by stacking chips without being tested. However, the package stacks may be thicker as compared with stacked chip packages, because of the thickness of each individual stacked package.

Stacked packages are also susceptible to warpage causing uneven or missing mounting features or electrical connections. Attempts to provide stacking features have met with difficult to control manufacturing, incompatible or incongruous materials, as well as insufficient structural integrity. The stacking features must provide both structural and electrical integrity and uniformity in order to provide reliable, high yield and functioning systems. In addition to providing the necessary structural and electrical integrity, the packages must provide an easy mounting process. The easy mounting process requires high yield for finished devices as well as known and economical manufacturing and equipment.

Every new generation of integrated circuits with increased operating frequency, performance and the higher level of large scale integration have underscored the need for back-end semiconductor manufacturing to increase the heat management capability within an encapsulated package. It is well acknowledged that when a semiconductor device becomes denser in term of electrical power consumption per unit volume, heat generated is also increases correspondingly. More and more packages are now designed with an external heat sink or heat slug to enhance the ability of heat being dissipated to the package ambient environment. As the state of the art progresses, the ability to adequately dissipate heat is often a constraint on the rising complexity of package architecture design, smaller footprint, higher device operating speed and power consumption.

As more functions are packed into the integrated circuits and more integrated circuits into the package, more heat is generated degrading the performance, the reliability, and the lifetime of the integrated circuits. As more circuitry is packed into the integrated circuits, the integrated circuit generates more radiated energy called electromagnetic interference (EMI). Unlike heat, EMI should not be dissipated to the environment but its energy should be absorbed by the system back to a ground plane.

Thus, a need still remains for a stackable multi-chip package system providing low cost manufacturing, improved reliability, increased thermal performance, EMI mitigation, and robust structural support for thin profile integrated circuit package. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a stackable multi-chip package system including forming an external interconnect, having a base and a tip, and a paddle; mounting a first integrated circuit die over the paddle; stacking a second integrated circuit die over the first integrated circuit die in a active side to active side configuration; connecting the first integrated circuit die and the base; connecting the second integrated circuit die and the base; and molding the first integrated circuit die, the second integrated circuit die, the paddle, and the external interconnect with the external interconnect partially exposed.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
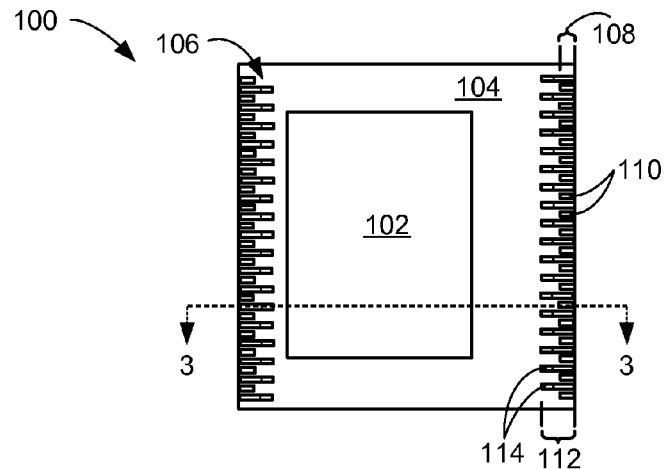
FIG. 1 is a top view of a stackable multi-chip package system in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material, patterning, exposure, development, etching, cleaning, molding, and/or removal of the material or as required in forming a described structure.

Referring now to FIG. 1, therein is shown a top view of a stackable multi-chip package system 100 in an embodiment of the present invention. The top view depicts a non-active side 102 of an integrated circuit die surrounded an encapsulation 104, such as an epoxy mold compound. The non-active side 102 may serve as a thermal dissipation path for the stackable multi-chip package system 100.

The stackable multi-chip package system 100 has dual land rows 106. The dual land rows 106 have a first row 108 of first lands 110, such as copper alloy, nickel/palladium, or gold alloy land sites, and a second row 112 of second lands 114, such as copper alloy, nickel/palladium, or gold alloy land sites. The first lands 110 and the second lands 114 may be made from any number of materials to provide a bondable surface. The second lands 114 extend more to the interior of the stackable multi-chip package system 100 than the first lands 110. The first row 108 and the second row 112 are staggered allowing connection to the first lands 110 without impeding connections to the second lands 114.

For illustrative purposes, the stackable multi-chip package system 100 is shown having the dual land rows 106, although it is understood that the number of rows may differ. Also for illustrative purposes, both top and bottom surfaces of the stackable multi-chip package system 100 are shown having first lands 110 and the second lands 114, although it is understood that the stackable multi-chip package system 100 may not have both land types or may not be on both the top and bottom surfaces. Further for illustrative purposes, the non-active side 102 is exposed to ambient, although it is understood that the non-active side 102 may not be exposed.

Figure 2:
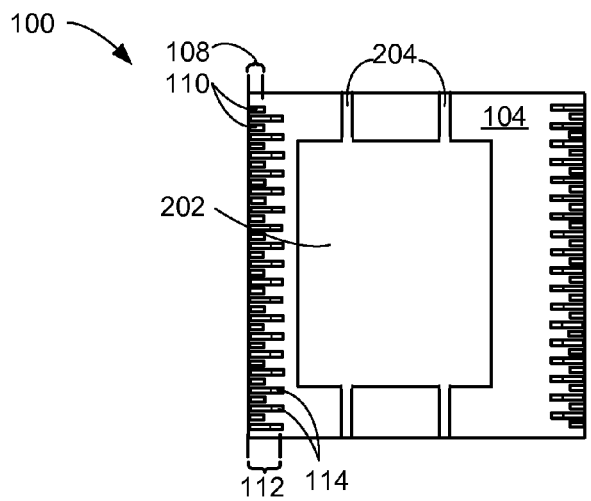
FIG. 2 is a bottom view of the stackable multi-chip package system of FIG. 1.

Referring now to FIG. 2, therein is shown a bottom view of the stackable multi-chip package system 100 of FIG. 1. The bottom view depicts a paddle 202, such as a die-attach paddle, a heat sink, an electromagnetic interference shield, or a planar rigidity structure for mitigating warpage, surrounded by the encapsulation 104. Paddle segments 204 extend from the paddle 202 to edges of the stackable multi-chip package system 100. The bottom view also depicts the first row 108 having the first lands 110 and the second row 112 having the second lands 114.

Figure 3:
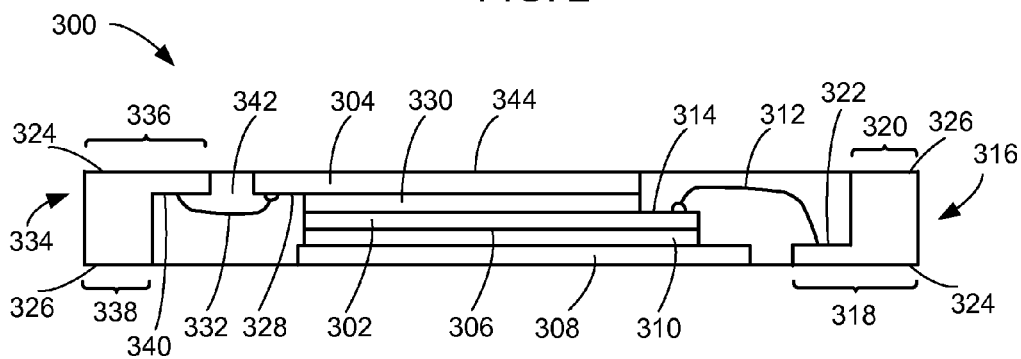
FIG. 3 is a cross-sectional view of a stackable multi-chip package system in an embodiment of the present invention.

Referring now to FIG. 3, therein is shown a cross-sectional view of a stackable multi-chip package system 300 along in an embodiment of the present invention. This cross-sectional view may also represent the cross-sectional view of the stackable multi-chip package system 100 along the segment line 3-3 of FIG. 1. The stackable multi-chip package system 300 includes a stack of integrated circuit dice with a first integrated circuit die 302, such as a thin or ultra thin integrated circuit die, below a second integrated circuit die 304, such as a thin or ultra thin integrated circuit die. The second integrated circuit die 304 and the first integrated circuit die 302 may be the same or the same type, such as functionality or technology, or may be different.

A first non-active side 306 of the first integrated circuit die 302 is attached to a paddle 308, such as die-attach paddle, with a first adhesive 310, such a die-attach adhesive. First internal interconnects 312, such as bond wires or ribbon bond wires, connect a first active side 314 of the first integrated circuit die 302 and first external interconnects 316, such as leads.

The first external interconnects 316 have L-shape configurations with first bases 318 of the L-shape configurations extending more to the interior of the stackable multi-chip package system 300 than first tips 320 of the L-shape configuration. The first internal interconnects 312 attach to first inner portions 322 of the first bases 318. Sides of the first bases 318 opposite the first inner portions 322 are part of second lands 324 of the second row 112 of FIG. 2. The first tips 320 are part of first lands 326 of the first row 108 of FIG. 1.

A second active side 328 of the second integrated circuit die 304 is attached to the first active side 314 with an inter-chip structure 330, such as a die-attach adhesive or a spacer. The second integrated circuit die 304 is offset from the first integrated circuit die 302 such that the second integrated circuit die 304 does not perturb the connections of the first internal interconnects 312 and the first integrated circuit die 302. Second internal interconnects 332 connect the second active side 328 and second external interconnects 334.

The second external interconnects 334 are shown in similar L-shape configurations as the first external interconnects 316 but rotated 180 degrees or referred to as inverted from the first external interconnects 316. Second bases 336 of the second external interconnects 334 overhang second tips 338 of the second external interconnects 334. The second internal interconnects 332 attach to second inner portions 340 of the second bases 336. Sides of the second bases 336 opposite the second inner portions 340 are part of the second lands 324 of the second row 112 of FIG. 1. The second tips 338 are part of the first lands 326 of the first row 108 of FIG. 2.

An encapsulation 342, such as an epoxy mold compound, covers the first integrated circuit die 302, the second internal interconnects 332, and the first internal interconnects 312. The encapsulation 342 partially covers the first external interconnects 316 exposing the first lands 326 and the second lands 324 of the first external interconnects 316 as well as the exterior sides between the first bases 318 and the first tips 320. Similarly, the encapsulation 342 partially covers the second external interconnects 334 exposing the first lands 326, the second lands 324 of the second external interconnects 334 as well as the exterior sides between the second bases 336 and the second tips 338. The first lands 326 of the first external interconnects 316 are coplanar with the second lands 324 of the second external interconnects 334. Also the second lands 324 of the first external interconnects 316 are coplanar with the first lands 326 of the second external interconnects 334. The surface of the encapsulation 342 may be coplanar with the first lands 326 and the second lands 324.

A side of the paddle 308 opposite the first integrated circuit die 302 is exposed to ambient. The paddle 308 may serve other functions, such as a heat sink, an electromagnetic interference (EMI) shield, or a planar rigidity structure for mitigating warpage. A second non-active side 344 of the second integrated circuit die 304 is also exposed to ambient.

The staggered configuration of the first row 108 of FIG. 1 and the second row 112 of FIG. 1 formed by the first external interconnects 316 and the second external interconnects 334 at alternating locations forms mold interlock features. The interlock features improves performance in moisture sensitivity level (MSL) tests as well as increase structural rigidity.

The stackable multi-chip package system 300 may be tested to verify known good devices (KGD) of the second integrated circuit die 304 and the first integrated circuit die 302. The stackable multi-chip package system 300 may be a thin package, especially with thin or ultra-thin dice, having a package height of 0.20 mm.

Figure 4:
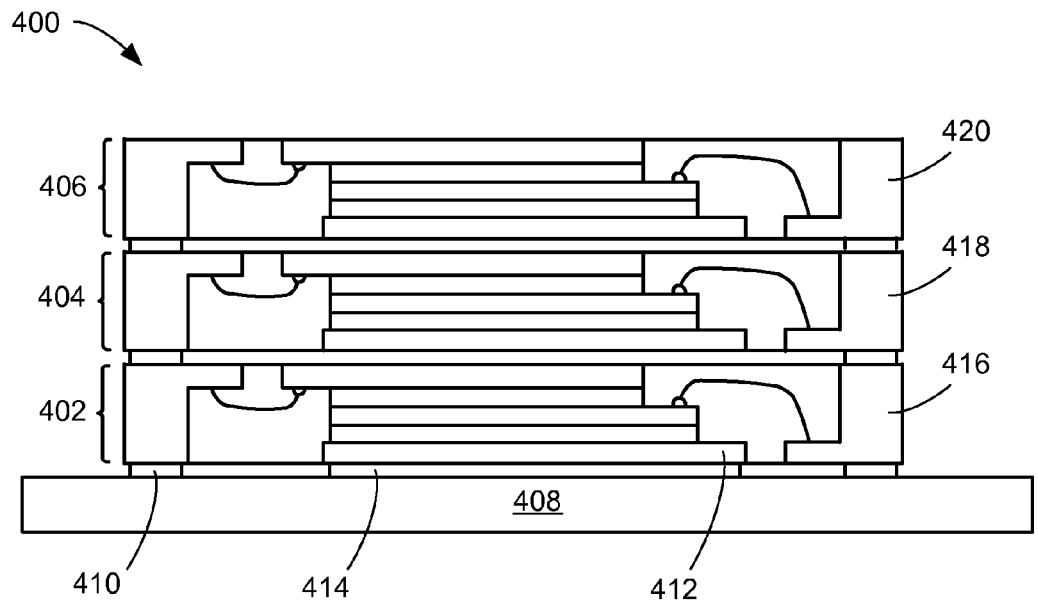
FIG. 4 is a cross-sectional view of an integrated circuit package-on-package system with the stackable multi-chip package system in an alternative embodiment of the present invention.

Referring now to FIG. 4, therein is shown a cross-sectional view of an integrated circuit package-on-package system 400 with the stackable multi-chip package system 300 in an alternative embodiment of the present invention. The integrated circuit package-on-package system 400 as a first package 402 stacked below a second package 404 with the second package 404 below a third package 406. The first package 402, the second package 404, and the third package 406 may be of similar or substantially the same structure as the stackable multi-chip package system 300 of FIG. 3.

The first package 402 is attached on a substrate 408, such as a printed circuit board, with a conductive material 410, such as a solder paste. A paddle 412 of the first package 402 is attached to the substrate 408 with an adhesive 414, such as a thermal adhesive, film adhesive or solder paste. The substrate 408 may serve various functions, such as a system level heat sink or a ground source, for the paddle 412. First package external interconnects 416 are connected to the substrate 408 with the conductive material 410.

The second package 404 stacks on the first package 402 with second package external interconnects 418 connected to tops of the first package external interconnects 416 with the conductive material 410. Similarly, the third package 406 stacks on the second package 404 with third package external interconnects 420 connect to tops of the second package external interconnects 418 with the conductive material 410.

The first package 402, the second package 404, and the third package 406 may be tested to ensure KGD before the package-on-package assembly process. This ensures any bad device is sorted out such that the yield for the integrated circuit package-on-package system 400 is not impacted by bad device. The integrated circuit package-on-package system 400 may further undergo testing during and after assembly.

Figure 5:
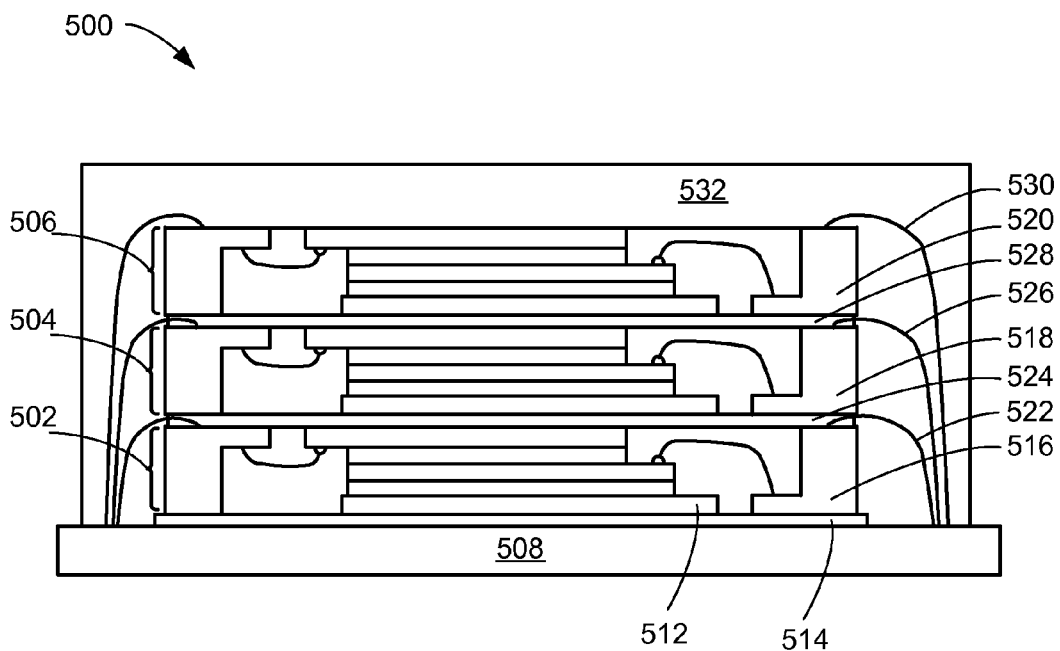
FIG. 5 is a cross-sectional view of an integrated circuit package-in-package system with the stackable multi-chip package system in another alternative embodiment of the present invention.

Referring now to FIG. 5 is cross-sectional view of an integrated circuit package-in-package system 500 with the stackable multi-chip package system 300 in another alternative embodiment of the present invention. The integrated circuit package-in-package system 500 as a first package 502 stacked below a second package 504 with the second package 504 below a third package 506. The first package 502, the second package 504, and the third package 506 may be of similar or substantially the same structure as the stackable multi-chip package system 300 of FIG. 3.

The first package 502 is attached on a substrate 508, such as a printed circuit board, with an adhesive 514, such as a thermal adhesive. The substrate 508 may serve various functions, such as a system level heat sink or a ground source, for a paddle 512. First package external interconnects 516 of the first package 502 are connected to the substrate 508 with first interconnects 522, such as bond wires.

The second package 504 stacks over the first package 502 with a first intra-stack structure 524, such as a film adhesive. Second package external interconnects 518 of the second package 504 are connected to the substrate 508 with second interconnects 526, such as bond wires.

Similarly, the third package 506 stacks over the second package 504 with a second intra-stack structure 528, such as a film adhesive. Third package external interconnects 520 of the third package 506 are connected to the substrate 508 with third interconnects 530, such as bond wires.

A package encapsulation 532 covers the first package 502, the second package 504, the third package 506, the first interconnects 522, the second interconnects 526, and the third interconnects 530. The package encapsulation 532 may be any number of materials, such as an epoxy molding compound.

The first package 502, the second package 504, and the third package 506 may be tested to ensure KGD before the package-in-package assembly process. This ensures any bad device is sorted out such that the yield for the integrated circuit package-in-package system 500 is not impacted by bad devices. The integrated circuit package-in-package system 500 may further undergo testing during and after assembly.

Figure 6:
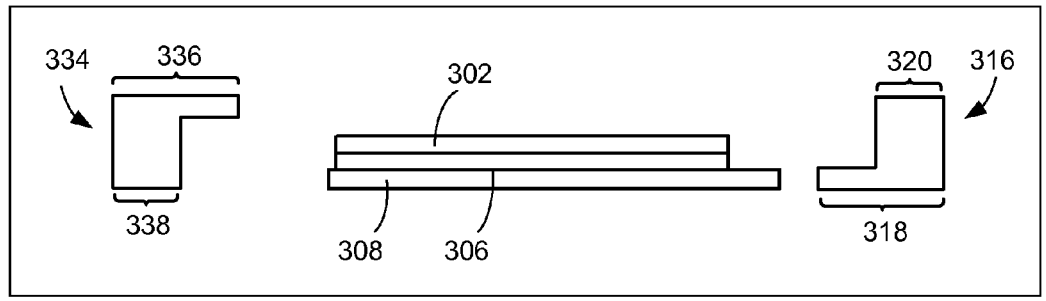
FIG. 6 is a cross-sectional view of the stackable multi-chip package system of FIG. 3 in a first die-attach phase.

Referring now to FIG. 6, therein is shown a cross-sectional view of the stackable multi-chip package system 300 of FIG. 3 in a first die-attach phase. The paddle 308, the first external interconnects 316, and the second external interconnects 334 are formed from a lead frame (not shown). The lead frame has a plurality of the set of the paddle 308, the first external interconnects 316 and the second external interconnects 334. The lead frame undergoes deep etch to form the first bases 318, the first tips 320, the second bases 336, and the second tips 338 as well as the paddle 308. The first non-active side 306 of the first integrated circuit die 302 is attached on the paddle 308 with the first adhesive 310. The paddle segments 204 of FIG. 2 hold the paddle 308 in the lead frame.

Figure 7:
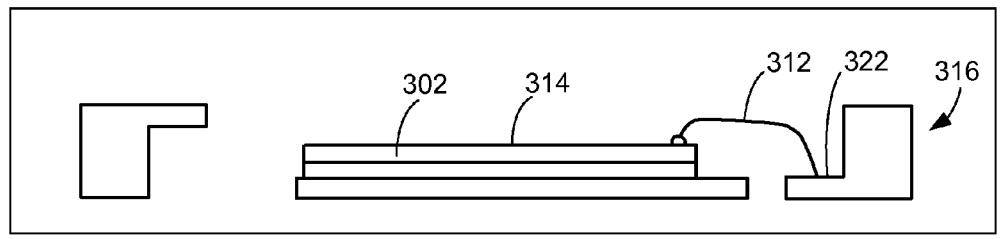
FIG. 7 is a cross-sectional view of the structure of FIG. 6 in a first interconnect-attach phase.

Referring now to FIG. 7, therein is shown a cross-sectional view of the structure of FIG. 6 in a first interconnect-attach phase. The first internal interconnects 312 connect the first active side 314 of the first integrated circuit die 302 and the first inner portions 322 of the first external interconnects 316.

Figure 8:
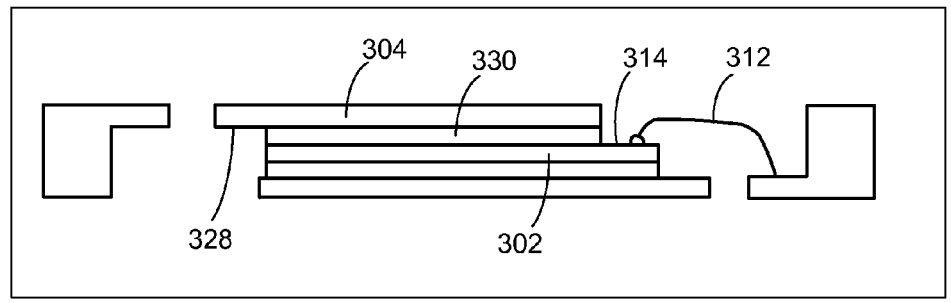
FIG. 8 is a cross-sectional view of the structure of FIG. 7 in a second die-attach phase.

Referring now to FIG. 8, therein is shown a cross-sectional view of the structure of FIG. 7 in a second die-attach phase. The second active side 328 of the second integrated circuit die 304 is attached to a portion of the first active side 314 of the first integrated circuit die 302 with the inter-chip structure 330. The second integrated circuit die 304 is offset to the first integrated circuit die 302 such that the first internal interconnects 312 are not disturbed by the second integrated circuit die 304.

Figure 9:
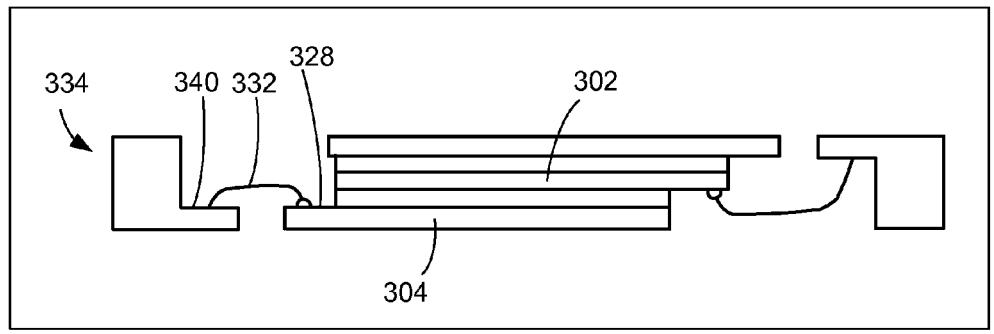
FIG. 9 is a cross-sectional view of the structure of FIG. 8 flipped in a second interconnect-attach phase.

Referring now to FIG. 9, therein is shown a cross-sectional view of the structure of FIG. 8 flipped in a second interconnect-attach phase. The structure of FIG. 8 is vertically flipped. The second internal interconnects 332 connect the second active side 328 of the second integrated circuit die 304 and the second inner portions 340 of the second external interconnects 334. The second integrated circuit die 304 and the first integrated circuit die 302 are offset such that the connections of the second internal interconnects 332 are not impeded by the first integrated circuit die 302.

Figure 10:
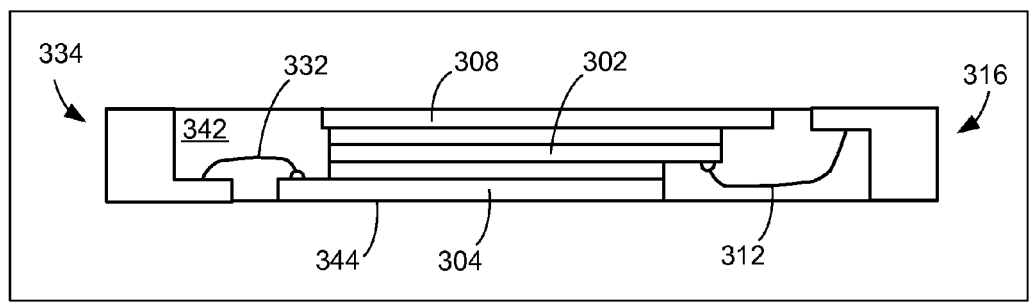
FIG. 10 is a cross-sectional view of the structure of FIG. 9 in a molding phase.

Referring now to FIG. 10, therein is shown a cross-sectional view of the structure of FIG. 9 in a molding phase. The structure of FIG. 9 undergoes a molding and post molding cure processes forming the encapsulation 342. The encapsulation 342 covers the first integrated circuit die 302, the first internal interconnects 312, and the second internal interconnects 332. The encapsulation 342 also partially covers the paddle 308, the first external interconnects 316, and the second external interconnects 334 with the second non-active side 344 of the second integrated circuit die 304 exposed.

Figure 11:
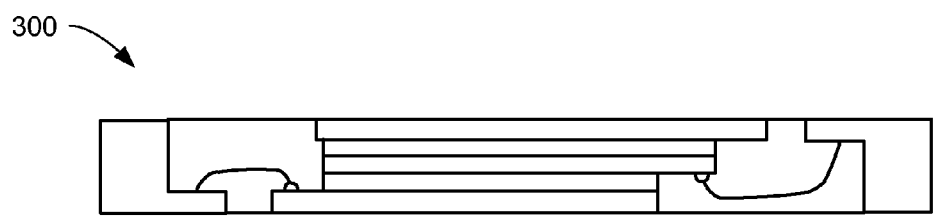
FIG. 11 is a cross-sectional view of the structure of FIG. 10 in a singulation phase.

Referring now to FIG. 11, therein is shown a cross-sectional view of the structure of FIG. 10 in a singulation phase. The structure of FIG. 10 may undergo an optional plating process, such as plating gold, for improved conductivity and bonding. The structure of FIG. 10 is singulated from the lead frame (not shown) forming the stackable multi-chip package system 300.

Figure 12:
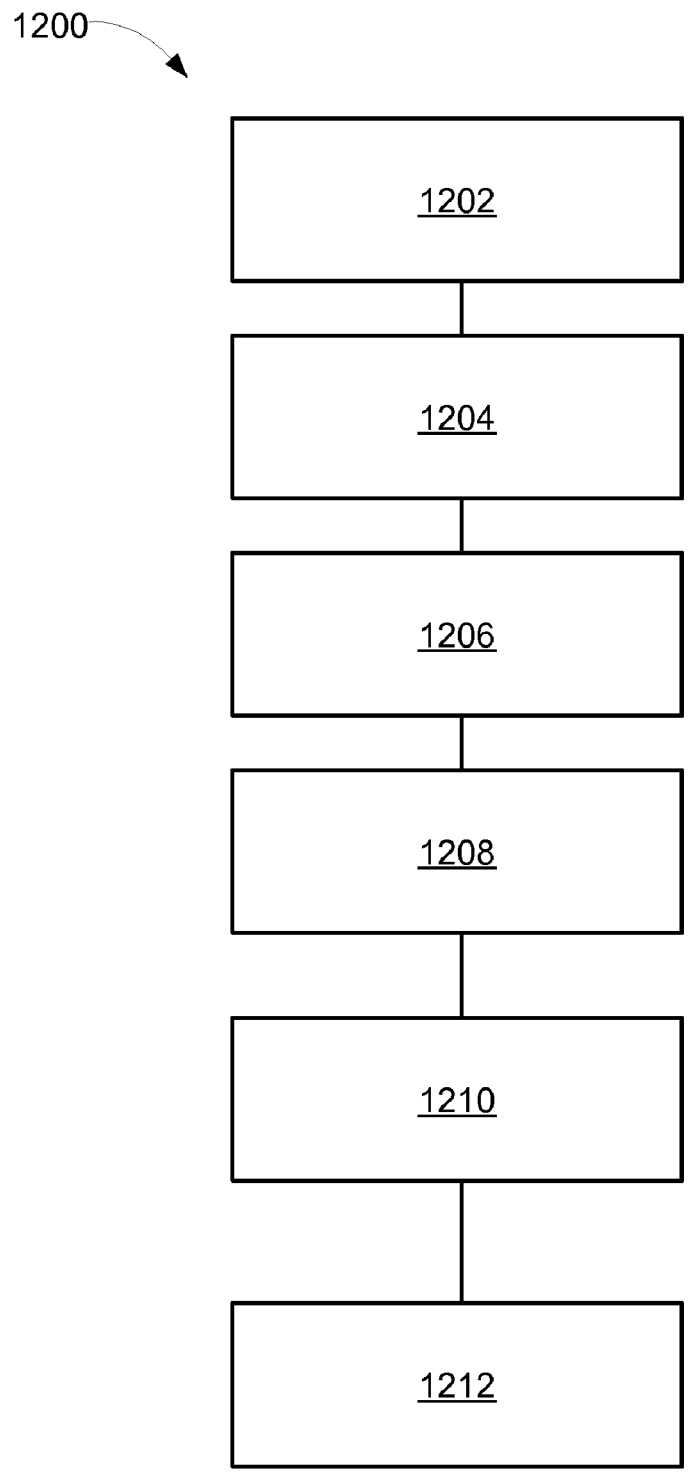
FIG. 12 is a flow chart of a stackable multi-chip package system for manufacture of the stackable multi-chip package system in an embodiment of the present invention.

Referring now to FIG. 12, therein is shown a flow chart of a stackable multi-chip package system 1200 for manufacture of the stackable multi-chip package system 300 in an embodiment of the present invention. The system 1200 includes forming an external interconnect, having a base and a tip, and a paddle in a block 1202; mounting a first integrated circuit die over the paddle in a block 1204; stacking a second integrated circuit die over the first integrated circuit die in a block 1206; connecting the first integrated circuit die and the external interconnect in a block 1208; connecting the second integrated circuit die and the external interconnect in a block 1210; and molding the first integrated circuit die, the second integrated circuit die, the paddle, and the external interconnect with the external interconnect partially exposed in a block 1212.

It has been discovered that the present invention thus has numerous aspects.

It has been discovered that the present invention provides stackable multi-chip package having a very low package height with enhanced thermal performance, structural rigidity to prevent warpage, high lands count, and flexibility connection options from both the top and bottom of the package.

An aspect is that the present invention provides an offset face-to-face stacking configuration of the second integrated circuit die and the first integrated circuit die for providing a low package height. The face-to-face configuration refers to an active side to active side configuration.

Another aspect of the present invention provides an offset face-to-face stacking configuration of the second integrated circuit die and the first integrated circuit die for protection of the circuitry on the active sides of the integrated circuit dice as well as providing multiple thermal dissipation paths to ambient.

Yet another aspect of the present invention provides the die-attach paddle serving multiple functions. The die-attach paddle provides planar rigidity to mitigate warpage of the package as well the integrated circuit dice in the stack. The die-attach paddle may also server as a heat spreader. Further, the die-attach paddle may serve as an EMI shield when connected to ground.

Yet another aspect of the present invention provides a more robust package design and lead frame. The die-attach paddle eliminates the need for an adhesive tape attached to the lead frame in order to hold the integrated circuit die. This simplifies the manufacturing process and lowers the overall cost while utilizing proven technology with qualified structures available for mass production.

Yet another aspect of the present invention provides mold lock feature from the staggered configuration of the first and second external interconnects in the first and second rows of lands. This provides both additional structural support as well as improves performance in MSL tests.

Yet another aspect of the present invention provides the flexibility of stacking in different configurations, such as package-on-package or package-in-package configurations.

Yet another aspect of the present invention provides electrical connectivity on both the top and bottom of the package to accommodate different system connection requirements and stacking configurations.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the stackable multi-chip package system method of the present invention furnishes important and heretofore unknown and unavailable solutions, capabilities, and functional aspects for improving thermal performance, reducing EMI, and reliability in systems. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A stackable multi-chip package system comprising:
   external interconnects, wherein each of the external interconnects having a base and a tip;
   a paddle;
   a first integrated circuit die over the paddle;
   a second integrated circuit die over the first integrated circuit die in an active side to active side configuration;

a first internal interconnect between the first integrated circuit die and an inner portion of the base connected to the first integrated circuit die;

a second internal interconnect between the second integrated circuit die and the inner portion of the base connected to the second integrated circuit die includes the external interconnect connected to the second integrated circuit die is in an inverted configuration to the external interconnect connected to the first integrated circuit die; and an encapsulation to cover the first integrated circuit die, the second integrated circuit die, the paddle, and the external interconnect with the external interconnect partially exposed.

2. The system as claimed in claim 1 further comprising a first stackable multi-chip package system over a second stackable multi-chip package system.

3. The system as claimed in claim 1 further comprising:
a first stackable multi-chip package system over a substrate;
a second stackable multi-chip package system over the first stackable multi-chip package system; and
a package encapsulation to cover the first stackable multi-chip package system and the
second stackable multi-chip package system with the substrate.

4. The system as claimed in claim 1 wherein the second integrated circuit die over the first integrated circuit die in the face-to-face configuration has a second active side of the second integrated circuit die facing the first active side of the first integrated circuit die.

5. The system as claimed in claim 1 wherein:
the external interconnect is a L-shape external interconnect, having the base and the tip;
the paddle is a die-attach paddle;
the first integrated circuit die is on the paddle with an adhesive;
the second integrated circuit die over the first integrated circuit die is an offset and active side to active side configuration;
the interconnect, between the first integrated circuit die and the external interconnect, is to an inner portion of the base;
the interconnect, between the second integrated circuit die and the external interconnect, is to the inner portion of the base; and
the encapsulation is a cover for the first integrated circuit die and a partial cover for the second integrated circuit die, the paddle, and the external interconnect.

6. The system as claimed in claim 5 wherein the encapsulation is a cover for the first integrated circuit die and a partial cover for the second integrated circuit die, the paddle, and the external interconnect includes:
a second non-active side of the second integrated circuit die exposed; and
a side of the paddle opposite the first integrated circuit die exposed.

7. The system as claimed in claim 5 wherein the die-attach paddle is comprised of a conductive material having planar rigidity.

8. The system as claimed in claim 5 further comprising dual rows of lands with bases and tips exposed in alternating positions.

9. The system as claimed in claim 5 wherein the die-attach paddle is an electromagnetic interference shield.

* * * * *